United States Patent [19]
Melville et al.

[11] Patent Number: 5,930,153
[45] Date of Patent: Jul. 27, 1999

[54] SYSTEMS AND METHODS FOR TESTING AND MANUFACTURING LARGE-SCALE, TRANSISTOR-BASED, NONLINEAR CIRCUITS

[75] Inventors: Robert C. Melville, New Providence; Jaijeet Roychowdhury, Murray Hill, both of N.J.

[73] Assignee: Lucent Technologies, Inc., Murray Hill, N.J.

[21] Appl. No.: 08/845,963

[22] Filed: Apr. 30, 1997

[51] Int. Cl.$^6$ ........................................ G06F 17/50
[52] U.S. Cl. .............................. 364/578; 364/489
[58] Field of Search .................... 364/578, 488, 364/489, 490, 491; 324/73.1; 371/24

[56] References Cited

U.S. PATENT DOCUMENTS

| | | | |
|---|---|---|---|
| 5,047,971 | 9/1991 | Horwitz | 364/578 |
| 5,181,179 | 1/1993 | Fang et al. | 364/488 |

OTHER PUBLICATIONS

"Passivity and No–Gain Properties Establish Global Convergence of a Homotopy Method for DC Operating Points", by L. Trajkovic, R. Melville and S. Fang, IEEE International Symposium on Circuits and Systems, 1990, pp. 914–917, vol. 2.

"Improving DC Convergence in a Circuit Simulator Using a Homotopy Method", by L. Trajkovic, R. Melville and S. Fang, Custom Integrated Circuits Conference, 1991, Proceedings of the IEEE 1991, pp. 8.1/1–8.1/4.

"Finding DC Operating Points of Transistor Circuits Using Homotopy Methods", by L. Trajkovic, R. Melville and S. Fang, IEEE International Symposium on Circuits and Systems, 1991, pp. 758–761, vol. 2.

"Artificial Parameter Homotopy Methods for the DC Operating Point Problem", by R. Melville, L. Trajkovic, S. Fang and L. Watson, IEEE Transactions on Computer–Aided Design of Integrated Circuits and Systems, vol. 12, No. 6, Jun. 1993, pp. 861–877.

"Multi–Parameter Homotopy Methods for Finding DC Operating Points of Nonlinear Circuits", by D. Wolf and S. Sanders, IEEE International Symposium on Circuits and Systems, May 1993, ISCAS '93, pp. 2478–2481, vol. 4.

"Sufficient Conditions for Finding Multiple Operating Points of DC Circuits Using Continuation Methods", by M. Green and R. Melville, 1995 IEEE Internatiional Symposium on Circuits and Systems, ISCAS '95, pp. 117–120, vol. 1.

"An Efficient Continuation Method for Use in Globally Convergent DC Circuit Simulation", by M. Green, 1995 URSI International Symposium on Signals, Systems and Electronics, ISSE '1995, pp. 497–500.

"Multiparameter Homotopy Methods for Finding DC Operating Points of Nonlinear Circuits", by D. Wolf and S. Sanders, IEEE Transactions on Circuits and Systems I: Fundamental Theory and Applications, vol. 43, No. 10, Oct. 1996, pp. 824–838.

"HomSPICE: Simulator with Homotopy Algorithyms for Finding DC and Steady–State Solutions of Nonlinear Circuits", by I. Trajkovic, E. Fung and S. Sanders, Proceedings of the 1998 IEEE International Symposium on Circuits and Systems, 1998, ISCAS '98, pp. 227–231, vol. 6.

*Primary Examiner*—Kevin J. Teska
*Assistant Examiner*—Russell W. Frejd

[57] ABSTRACT

Systems and methods that include a homotopy technique are employed to find a DC operating point of large-scale, transistor-based, nonlinear circuits[, allowing such circuits to be designed, tested and manufactured]. The systems and methods use arclength continuation together with a new two-phase embedding of $\lambda$ into equations describing the circuits. One of the systems includes: (1) a DC operating point determination circuit (or determinor) that receives parameters relating to the nonlinear circuit into a globally-convergent model thereof and embeds therein at least two arclength continuation parameters relating to driving-point and transfer characteristics of a transistor in the nonlinear circuit[, the DC operating point determination circuit capable of adjusting the arclength continuation parameters to cause the globally-convergent model to converge on a DC operating point for the nonlinear circuit] and (2) an analysis circuit, coupled to the DC operating point determination circuit, that employs the DC operating point to determine an overall response characteristic of the nonlinear circuit

21 Claims, 6 Drawing Sheets

SYSTEMS AND METHODS FOR TESTING AND MANUFACTURING LARGE-SCALE, TRANSISTOR-BASED, NONLINEAR CIRCUITS

TECHNICAL FIELD OF THE INVENTION

The present invention is directed, in general, to nonlinear circuits and, more specifically, to systems and methods for designing, testing and manufacturing large-scale, transistor-based, nonlinear circuits that rely on an initial proper determination of the DC operating point of such circuits.

BACKGROUND OF THE INVENTION

A problem of considerable practical importance in circuit design is that of finding the DC operating point of a nonlinear circuit. The operating point, apart from being important in itself, is a prerequisite for subsequent tasks such as small-signal, transient, and noise analyses that are repeatedly invoked in the design of a circuit. From a simulation standpoint, finding an operating point corresponds to solving a system of nonlinear equations describing the circuit. The Newton-Raphson method, widely used in circuit simulators for solving nonlinear equations, often fails to converge to a solution. Despite the advent of other approaches (e.g., stepping or pseudo-transient), no technique has emerged that solves the operating point problem reliably and efficiently. As a result, DC convergence problems often create a significant bottleneck in the design process, especially for large circuits.

Homotopy or continuation methods are a relatively recent numerical technique for solving systems of nonlinear equations. These methods are appealing because they can be proven to be globally convergent, a property that eludes other nonlinear solution techniques. Previous applications of homotopy to solving the operating point problem include parameter switching, piecewise-linear ("PL") methods and arclength continuation. Despite the guarantee of convergence offered by the theory of homotopy, however, problems related to efficiency and numerics encountered in it has not so far had a significant impact on practical circuit simulation and design. So far, the successful use of homotopy on circuits containing more than a few nonlinear devices, or using realistic nonlinear device models, has so far been limited to medium-sized bipolar circuits.

The principle of continuation is similar to that of source or gmin stepping. (Stepping is also known as "monotonic continuation," familiar to users of circuit simulators, such as SPICE.) The circuit equations are modified by introducing a single continuation parameter $\lambda$. The parameter $\lambda$ is first set to a value ($\lambda$=0 by convention) at which the circuit becomes easy to solve or its solution becomes known. The parameter $\lambda$ is then slowly changed back to a value at which the original circuit is retrieved ($\lambda$=1) and simultaneously, the solution of the changing circuit is followed. The underlying hypothesis is that small changes in the parameter $\lambda$ cause small changes to the circuit and its solution, hence the new solution is relatively easy to obtain using numerical techniques with local convergence properties (e.g., the Newton-Raphson method). It appears natural to expect this hypothesis to hold for circuits described by equations that are smooth (i.e., continuous and several times differentiable).

For many practical circuits, however, this assumption is not true. One example is the Schmitt trigger circuit, where stepping can fail at critical values of the continuation parameter because the state of the circuit can change abruptly from low to high (and vice versa) for even the slightest monotonic change in the parameter. The phenomenon is illustrated in FIG. 1. As supply voltage $V_{cc}$ is stepped upward from 0 V, the output characteristic 100 of the circuit (not shown) suffers a large jump 110 at $V_{cc} \approx 4.5$ V. Points where monotonic increases or decreases of the continuation parameter lead to an abrupt jump in the solution are termed "turning points" or "folds." Many practical feedback systems composed of smoothly-behaved components exhibit turning points that can cause stepping algorithms to fail.

It is in the treatment of turning points that homotopy differs from stepping. By appropriately incrementing or decrementing the continuation parameter, discontinuities in the solution are avoided when turning points are encountered. For the Schmitt trigger output characteristic 100 of FIG. 1, this corresponds to reducing $V_{cc}$ after th turning point at $V_{cc} \approx 4.5$ V is reached, taking care to follow the central section of the output characteristic 100 and not backtrack onto the initial section already covered. Another turning point 120 is reached at $V_{cc} \approx 3$ V, after which $V_{cc}$ is increased again and the lower right section of the output characteristic 100 followed.

Some versions of continuation (e.g., parameter switching) rely on the detection and special treatment of turning points. Arclength continuation, on the other hand, can negotiate turning points automatically without their explicit detection. Its power stems from that it does not treat the continuation parameter $\lambda$ differently from the unknowns of the circuit being solved for, but treats it s another unknown whose next value on the curve it determines. For the Schmitt trigger circuit of FIG. 1, the process corresponds to "walking" along the output characteristic 100 without paying special heed to curvature and folds or treating $V_{cc}$ as special. More precisely, the technique solves a special ordinary differential equation (the "defining ODE") that produces as output a sequence of values of $\lambda$ (in general not monotonically increasing) together with solutions of the circuit at these values of $\lambda$. The key property of this sequence is that a point where $\lambda$=1 is always reached; therefore that point is the desired solution of the original circuit.

Any nonlinear circuit's equations can be put in the general form (barred variables denote vectors):

$$g(x)=0 \qquad (1)$$

To apply homotopy, the parameter $\lambda$ is embedded into this system to yield a related system:

$$f(x,\lambda)=0 \qquad (2)$$

The embedding of $\lambda$ is designed so as to reduce f to the original system at $\lambda$=1, i.e., $f(x,1)=g(x)$. In addition, a start system $f(x,0)=0$ is constructed so as be easy to solve by traditional methods. By solving the defining ODE for the problem, the arclength continuation algorithm generates samples $\{(x^i, \lambda^i)\}$ of the continuation track. Every point on the track satisfies Equation 2, hence, when $\lambda^i=1$ is reached, $x^i$ is a solution of $g(x)=0$.

Different types of homotopy continuation tracks are possible, as illustrated in a graph in FIG. 2. The horizontal axis of the graph in FIG. 2 depicts the progress of a single $\lambda$, which varies between 0 and 1. The vertical axis of the graph in FIG. 2 represents the solution of the circuit at a given value of the single $\lambda$. The homotopy algorithm starts at $\lambda$=0 and generates points on the track until $\lambda$=1 is reached.

It can be shown that the top four kinds of track 210, 220, 230, 240 in FIG. 2 cannot occur with arclength continuation, and that the situation depicted by the fifth (dashed bold) track 250 is extremely unlikely to occur (a probability-0 event). Another possibility (not illustrated), a bounded space-filling curve that does not reach $\lambda=1$, can also be shown to be impossible. A lowermost track 260 illustrates the normal, extremely likely (or probability-1) case of tracks that reach $\lambda=1$ without bifurcations.

An important concept in arclength continuation is that of the tangent vector, which has a simple interpretation: it is the tangent to the track at any point. Two instances 261, 262 of the tangent vector are shown on the lowermost track. Generally speaking, the algorithm proceeds by calculating the tangent vector from which it determines the next point on the curve by extrapolation. Turning points correspond to the $\lambda$-component of the tangent vector becoming 0; two turning points are shown on the lowermost curve in FIG. 2.

How $\lambda$ is embedded in f is crucial for continuation to work robustly and efficiently in practice. A simple embedding that satisfies the requirements of arclength continuation is the following:

$$f(x,\lambda) \approx \lambda g(x)+(1-\lambda)(x-a) \qquad (3)$$

where a is a constant vector. The above equation has a simple circuit interpretation: the current through each device is multiplied by $\lambda$ and new resistors and current sources are added from each node to ground, of conductance $1-\lambda$ and current $(1-\lambda)a_i$ respectively. A variation is to consider only the nonlinear elements (e.g., metal oxide semiconductor, or "MOS", devices) when adding the conductances.

Turning now to FIG. 3, illustrated is a simple, prior art homotopy 300 for MOS devices. Currents through a resistor 310 are multiplied by $1-\lambda$ while the currents through a MOS 320 are multiplied by $\lambda$, as indicated by Equation (3). This straightforward embedding of the prior art is, however, ineffective for most large circuits. Excessively long tracks or outright failure of the numerical method for solving the defining ODE result. Solving for an operating point using arclength continuation with this embedding can be inferior to even traditional Newton-Raphson methods.

Therefore, what is needed in the art is a technique to allow successful practical application of arclength continuation to the operating point problem for large circuits, typically primarily comprising transistor or MOS devices to allow such circuits to be efficiently designed and manufactured.

SUMMARY OF THE INVENTION

To address the above-discussed deficiencies of the prior art, the present invention provides systems and methods for testing and manufacturing a transistor-based nonlinear circuit. One of the systems includes: (1) a DC operating point determination circuit (or determinor) that receives parameters relating to the nonlinear circuit into a globally-convergent model thereof and embeds therein at least two arclength continuation parameters relating to driving-point and transfer characteristics of a transistor in the nonlinear circuit, the DC operating point determination circuit capable of adjusting the arclength continuation parameters to cause the globally-convergent model to converge on a DC operating point for the nonlinear circuit and (2) an analysis circuit, coupled to the DC operating point determination circuit, that employs the DC operating point to determine an overall response characteristic of the nonlinear circuit.

The present invention therefore introduces a significant improvement to globally-convergent nonlinear circuit models, such as those based on homotopy, by requiring at least two arclength continuation parameters to be embedded in such models. The new embedding circumvents inefficiencies and numerical failures that limit the applicability of prior art, simpler embeddings, allowing convergence reliably to occur on virtually all practical circuits.

As stated above, the arclength continuation parameters relate to both driving-point and transfer characteristics of a transistor in the nonlinear circuit. Once found, the DC operating point of the nonlinear circuit forms the basis of subsequent characteristic determination or testing. The present invention can be embodied in hardware or software, as appropriate to the application thereof.

In one embodiment of the present invention, the globally-convergent model is a homotopic model. The present invention is not limited to homotopy, however. Later-discovered globally-convergent models may be embedded with multiple arclength continuation parameters to advantage.

In one embodiment of the present invention, the transistor is a MOS device. Although MOS-based circuits can display significant nonlinearities, the present invention is not limited to determining the DC operating point of only MOS-based circuits.

In one embodiment of the present invention, one of the at least two arclength continuation parameters relates to a drain-source driving-point characteristic of the transistor. In a related embodiment, one of the at least two arclength continuation parameters relates to an influence of gate voltage on drain-source current of the transistor. In one embodiment to be illustrated and described, the arclength continuation parameters relate to a MOS in the nonlinear circuit. However, other parameters may be included in the mode that relate to other components within the nonlinear circuit.

In one embodiment of the present invention, the overall response characteristic is selected from the group consisting of: (1) small-signal response, (2) transient response and (3) noise response. Those skilled in the art are familiar with the advantages inherent in knowing the DC operating point of a nonlinear circuit. However, the present invention is adapted to glean other characteristics of a nonlinear circuit, such as those set forth above.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For more complete understanding of the present invention, and the advantages thereof, reference is now made to the following descriptions taken in conjunction with the accompanying drawings, in which.

DETAILED DESCRIPTION

Figure 1:
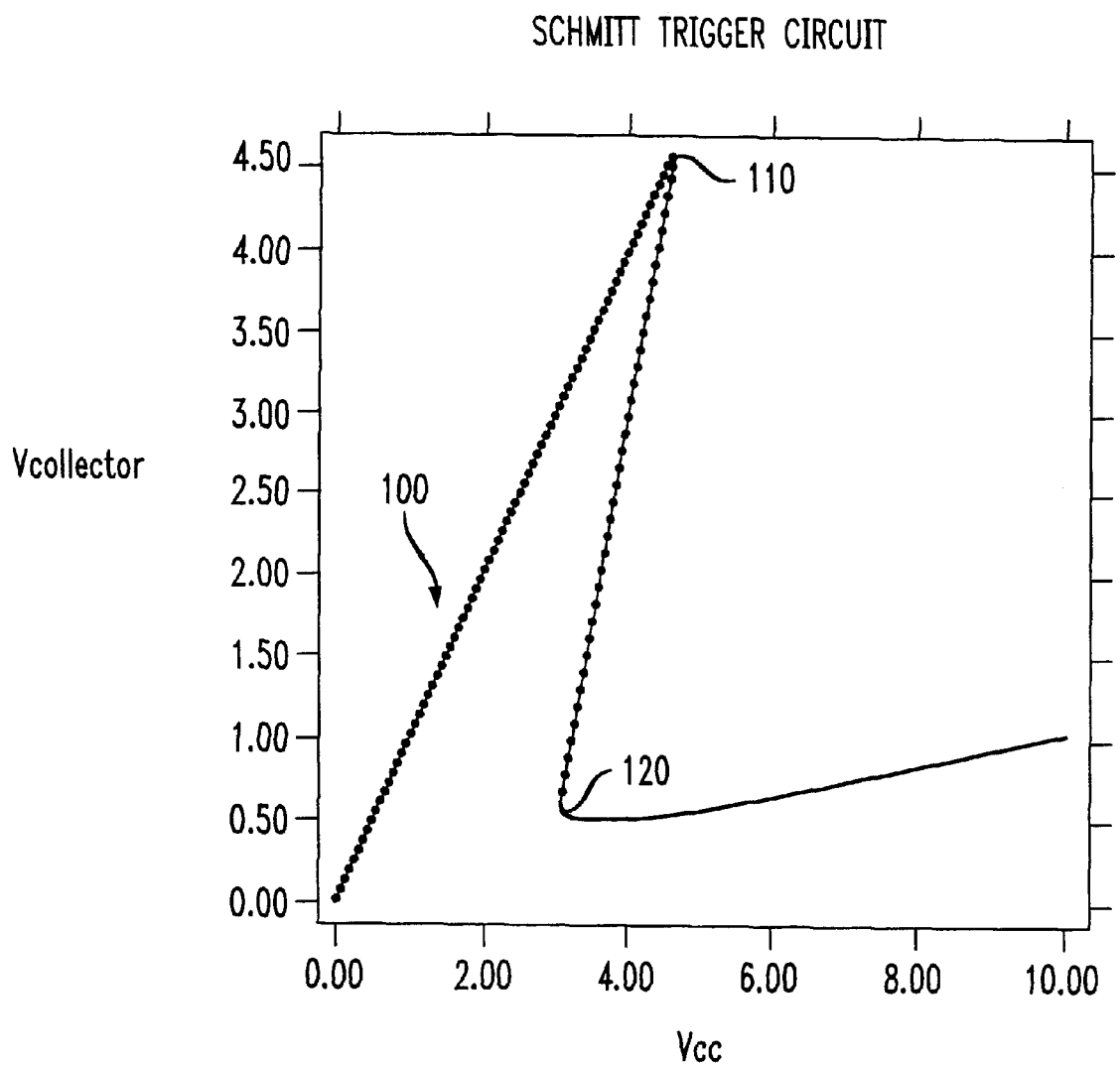
FIG. 1 illustrates circuit state characteristics of a Schmitt trigger circuit.
Figure 2:
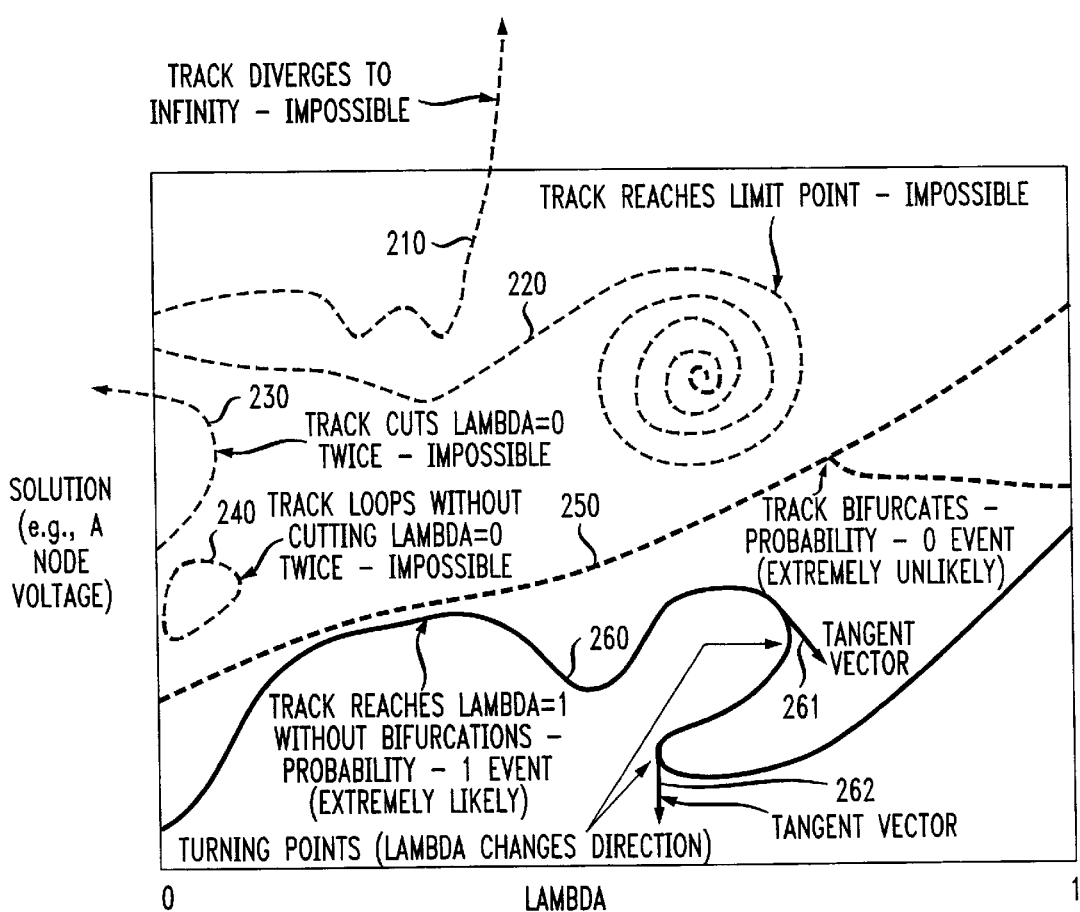
FIG. 2 illustrates different types of homotopy continuation tracks possible for a given nonlinear circuit.
Figure 3:
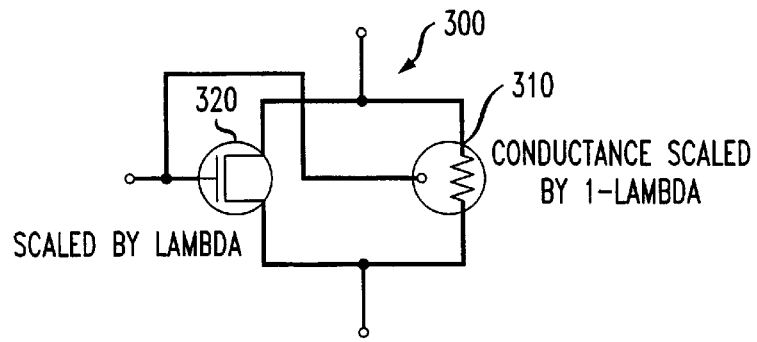
FIG. 3 illustrates a simple homotopy for MOS devices.
Figure 4:
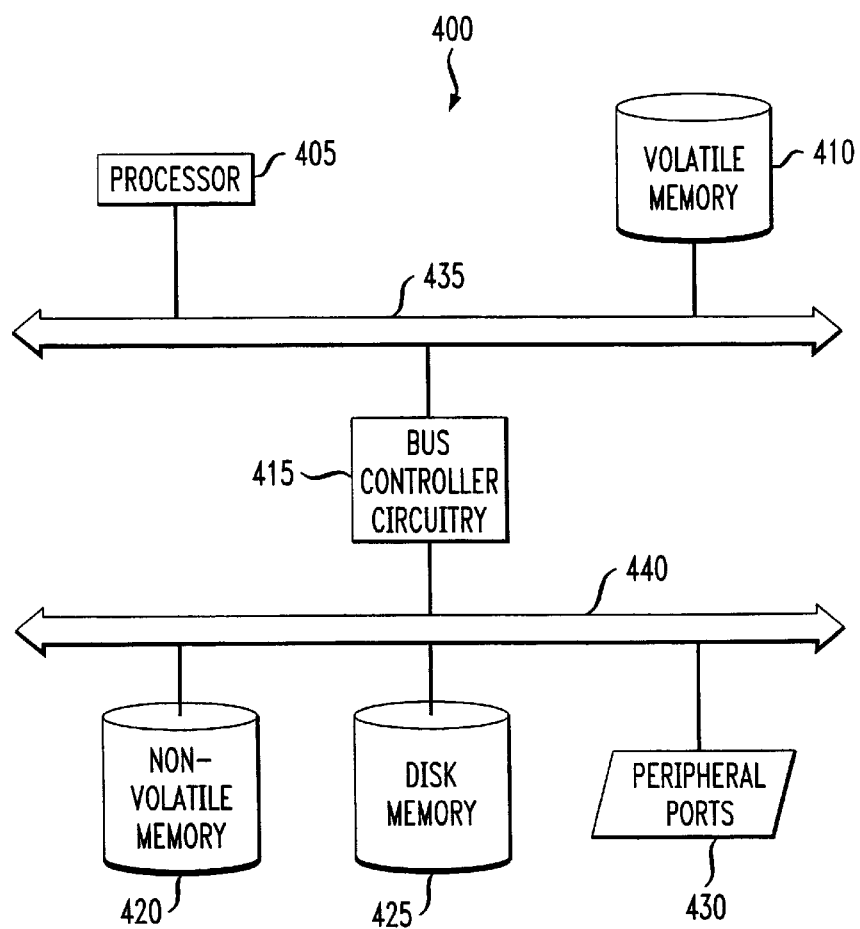
FIG. 4 illustrates a block diagram of an exemplary computer that may suitably provide an environment within which the present invention, in software form, may operate.

FIGS. 1, 2 and 3 have been described above and illustrate a problem the present invention addresses. Turning now to FIG. 4, illustrated is a block diagram of an exemplary computer (generally designated 400) that may suitably provide an environment within which the present invention, in software form, may operate. The present invention is not limited to application in a particular computing environment; thus, FIG. 4 is illustrative only. Alternate exemplary computers 400 may be personal, mini-, mainframe, super- or any other suitable stand-alone computers, as well as networks of computers, such as local area, and wide-area networks.

The exemplary computer 400 illustratively includes a processor 405, conventional volatile memory (e.g., random access memory) 410, bus controller circuitry 415, a conventional non-volatile memory (e.g., read-only memory) 420, a conventional video memory (e.g., video random access memory) 425 and a set of peripheral ports 430. An exemplary host bus 435 is shown and is suitably operative to associate the processor 405, the volatile memory 410 and the bus controller circuitry 415. An exemplary input/output ("I/O") bus 440 is shown and is operative to associate the bus controller circuitry 415, the non-volatile memory 420, the video memory 425 and the set of peripheral ports 430. The set of peripheral ports 430 may suitably couple the I/O bus 435 to any one or more of a plurality of conventional peripheral devices for communication therewith, such as communications circuitry for communicating with the Internet 415. Included among the set of peripheral ports 430 may be one or more serial or parallel ports.

The bus controller circuitry 415 provides suitable means by which the host bus 435 and the I/O bus 440 may be associated, thereby providing a path and management for communication therebetween. Each of the illustrated buses 435 and 440 requires a drive current to carry signals thereon. The illustrative circuit accordingly operates in conjunction with a conventional system controller (not shown) that supplies the required drive current.

In alternate advantageous embodiments, the processing circuitry associated with the exemplary computer 400 may, in whole or in part, be replaced by or combined with any suitable processing configuration, including parallel processors, programmable logic devices, such as programmable array logic ("PALs") and programmable logic arrays ("PLAs"), digital signal processors ("DSPs"), field programmable gate arrays ("FPGAs"), application specific integrated circuits ("ASICs"), large scale integrated circuits ("LSIs"), very large scale integrated circuits ("VLSIs") or the like, to form the various types of circuitry, controllers and systems described and claimed herein.

It should be noted that, while the computer 400 illustratively includes a dual-bus configuration, alternate embodiments may include single-bus or greater than two-bus configurations.

The present invention, in its software form, is embodied as a sequence of software instructions executable in the computer 400 to form a DC operating point determination circuit, an analysis circuit and other circuits associated with the present invention.

At the heart of the DC operation point determination circuit is a model that can be customized with parameters relating to a particular nonlinear circuit to be analyzed. The embodiment of the model herein described is symmetric and bulk-referenced, taking electrical bias inputs (parameters, in general) $V_{gb}=V_g-V_b$, $V_{sb}=V_s-V_b$ and $V_{db}=V_d-V_b$. $V_s$, $V_b$, $V_g$ and $V_d$, representing voltages at the source, bulk, gate and drain nodes, respectively, of a transistor (or, in more specific embodiments, a MOS) within the nonlinear circuit. In addition, the described model uses two homotopy parameters $\lambda_1$ and $\lambda_2$ which take values in the range of 0 to 1. $\lambda_1$ influences the drain-source driving-point characteristic, whereas $\lambda_2$ controls the transfer characteristic, i.e., the influence of the gate on the drain-source current.

The form of the drain-source current $I_{ds}$ for the homotopy of the present invention is:

$$I_{ds}=\beta[V'_{gs}(V_{gb},V_{db},V_{sb},\lambda_1,\lambda_2)]^2 h(V_{db}-V_{sb},\lambda_1) \qquad (4)$$

in which:

$$V'_{gs}(V_{gb},V_{db},V_{sb},\lambda_1,\lambda_2)=V-(V_{db}+C(V_{db}-V_{sb}) \qquad (5)$$

and:

$$C(x)=(x+|x|)/2+(\log(1+e^{-A|x|}))/A \qquad (6)$$

A=14.7 is illustrated as being a constant parameter and C(x) is a smooth clipping function.

The term $h(V_{db}-V_{sb},\lambda_1)$ may alternatively be expressed as $2/\pi \tan^{-1}(KV'_{ds}(V_{db}-V_{sb}),\lambda_1)$ in which:

$$V'_{ds}(V_{db}-V_{sb},\lambda_1)=V_{db}-V_{sb}=(V_{db}-V_{sb})S(0.1,1,\lambda) \qquad (7)$$

in which:

$$S(a,b,\lambda)=a(1-\lambda)+b\lambda \qquad (8)$$

and $\lambda_1$- and $\lambda_2$-modulated versions of $V_{gb}$, $V_{db}$ and $V_{sb}$ are defined:

$$V_{gb}=S(V^{nom}_{gb},V_{gb},\lambda_2) \qquad (9)$$

$$V_{db}=S(V_{db}/10,V_{db},\lambda_1) \qquad (10)$$

$$V_{sb}=S(V_{sb}/10,V_{sb},\lambda_1) \qquad (11)$$

Equation (4) is a single-piece model, qualitatively resembling a Schichman-Hodges ("SH") model, in that it contains a quadratic term in $V_{gs}$ multiplying a term determined by $V_{ds}$.

Figure 5:
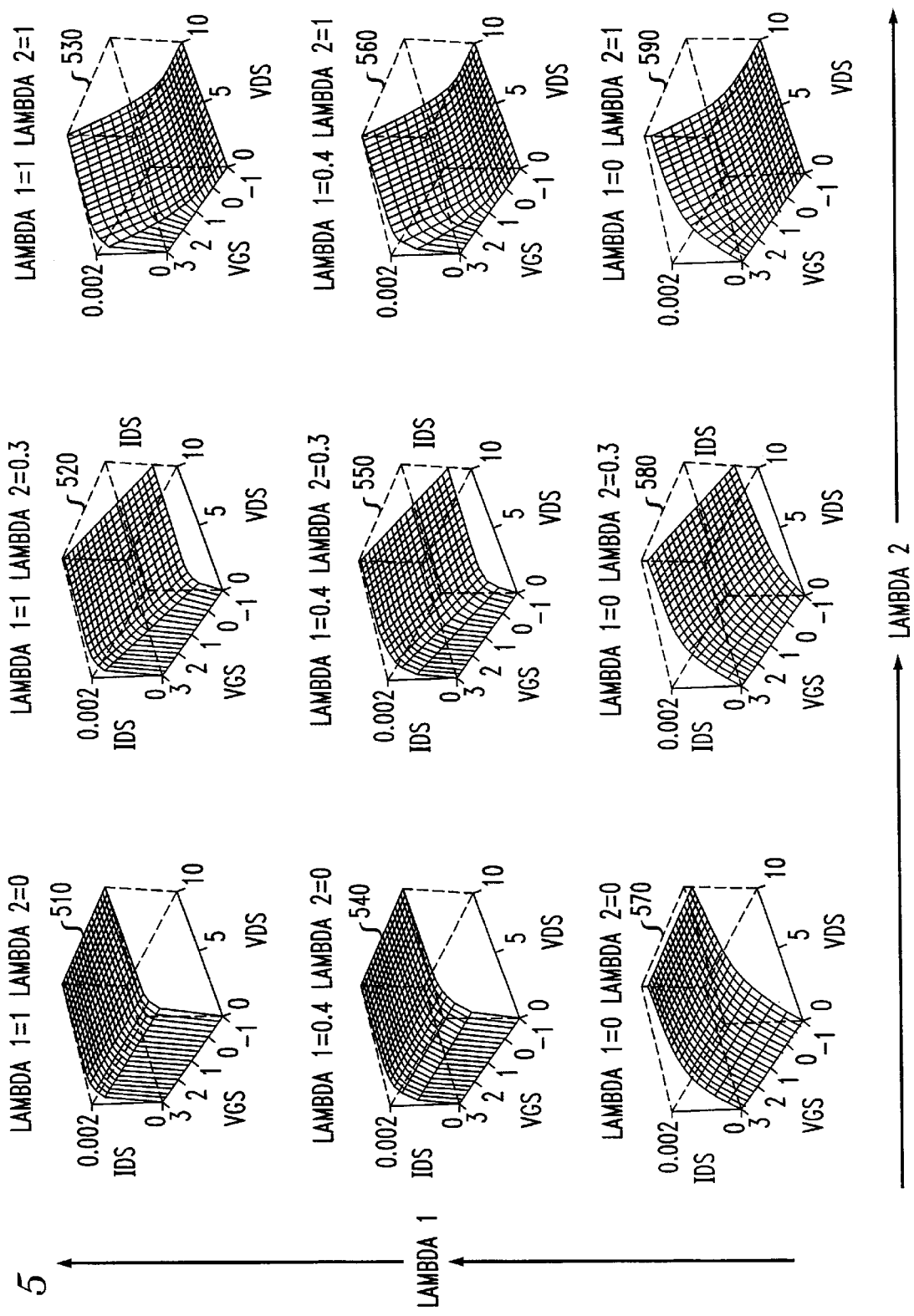
FIG. 5 illustrates model characteristics as a function of $\lambda_1$ and $\lambda_2$.

FIG. 5 illustrates characteristics of the above model as a function of $\lambda_1$ and $\lambda_2$. An appreciation of how varying $\lambda_1$ and $\lambda_2$ affects the characteristics of the model can be gained from FIG. 5. Each three-dimensional plot 510, 520, 530, 540, 550, 560, 570, 580, 590 in FIG. 5 represents the variation of drain-source current $I_{ds}$ (plotted on the vertical axes thereof) as a function of gate-source and drain-source voltages (plotted on the horizontal axes thereof) at fixed values of $\lambda_1$ and $\lambda_2$. $\lambda_1$ and $\lambda_2$ vary on the large vertical and horizontal axes. The plot 570 depicts $(\lambda_1,\lambda_2)=(0,0)$; the plot 530 depicts $(\lambda_1,\lambda_2)=(1,1)$. Moving vertically from bottom to top, $\lambda_1$ increases from 0 to 1. Likewise, $\lambda_2$ increases from 0 to 1 horizontally from left to right.

In the plot 530, $(\lambda_1,\lambda_2)=(1,1)$, the model characteristics are similar to that of the SH model, exhibiting a quadratic dependence on $V_{gs}$ and linear and saturation regions as a function of $V_{ds}$. In the plot 570, $(\lambda_1,\lambda_2)=(0,0)$, it can be seen that no transfer characteristic exists (varying $V_{gs}$ does not alter $I_{ds}$), and that the driving point characteristic is much less sharp than for the original MOS. The start system corresponds to the plot 570, $(\lambda_1,\lambda_2)=(0,0)$, at which each MOS device becomes a two-terminal, almost-linear resistor; hence the circuit becomes easy to solve using the Newton-Raphson method. (Typically, the start system takes fewer than 10 iterations to solve using Newton-Raphson.) The effect of varying $\lambda_1$, and $\lambda_2$ is also apparent from the FIG. 5: $\lambda_1$ sharpens the driving point characteristic without affecting the gain, whereas $\lambda_2$ ramps the gain without sharpening the driving-point characteristic.

Practical arc-length continuation algorithms are based on a single continuation parameter $\lambda$, leading to a system of n equations in n+1 variables. Since the model of the present invention has two continuation parameters, a system of n equations in n+2 variables results. One approach to converting this into a one-parameter homotopy is to add an extra equation to obtain a system of n+1 equations in n+2 variables to which a conventional homotopy solver can be applied.

It is necessary for the extra equation to be specified such that the solution of the original circuit is respected and that the requirements for arclength continuation continue to hold. Any smooth curve relating only $\lambda_1$ and $\lambda_2$ and passing through $(\lambda_1,\lambda_2)=(0,0)$ and $(\lambda_1,\lambda_2)=(1,1)$ satisfies the above conditions. An infinite number of such curves is possible; one such family 600 $\phi_m(\lambda_1,\lambda_2)=0$ is shown in FIG. 6.

Figure 6:
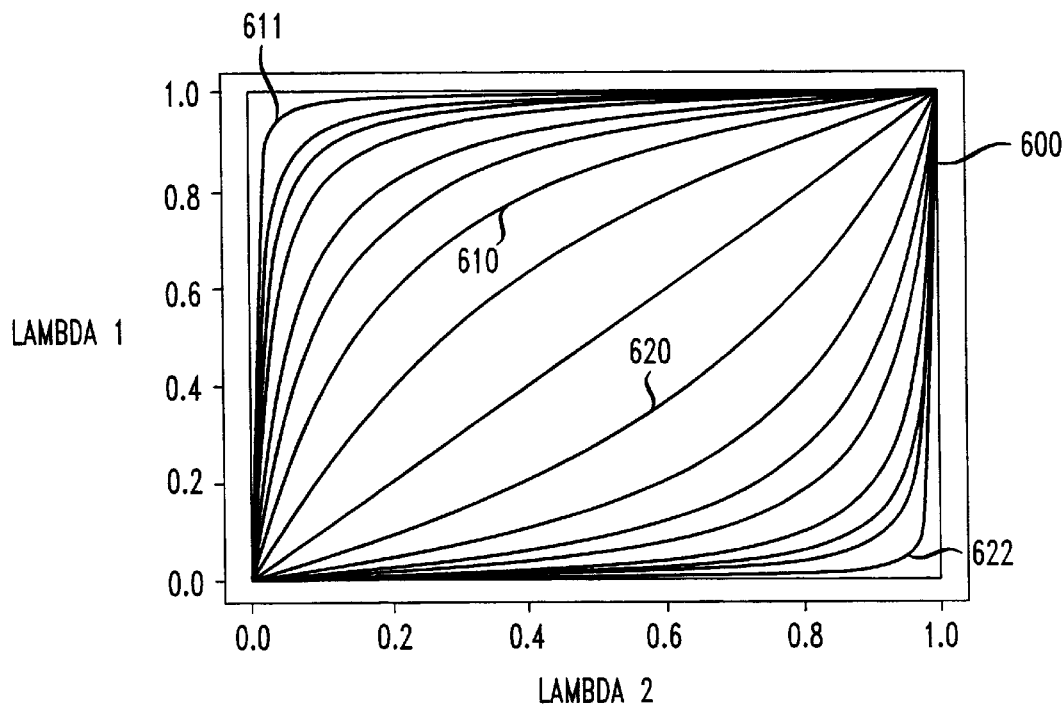
FIG. 6 illustrates a family $\phi_m(\lambda_1,\lambda_2)=0$ of equations employable to obtain a system of n+1 equations in n+2 variables to allow application of a conventional homotopy solver.

As $m \to 0$, $\psi_m(\lambda_1,\lambda_2) \to \lambda_1-\lambda_2$; as m increases from 0, $\psi_m(\lambda_1,\lambda_2)=0$ is shown by upper curves 610 in FIG. 6; likewise, as m decreases, $\psi_m(\lambda_1,\lambda_2)=0$ is shown by lower curves 620. Of interest are limiting curves 611, 621 obtained as $m \to \pm\infty$, given by the left and upper boundaries of FIG. 6, and by its lower and right boundaries, respectively. Corresponding to these limit curves are the first column of plots 510, 540, 570 and top row of plots 510, 520, 530 of FIG. 5, and the bottom row of plots 570, 580, 590 and third column of plots 530, 560, 590, respectively.

While these limit curves 611, 621 are not smooth (violating smoothness requirements for arclength continuation methods), they have the property of decoupling the homotopy into two independent parts, one controlled by $\lambda_1$ keeping $\lambda_2$ fixed, the other by $\lambda_2$ keeping $\lambda_1$ fixed. For the $m \to +\infty$ limit curve 611, $\lambda_1$ is ramped first, whereas for the $m \to -\infty$ limit curve 621, $\lambda_2$ is ramped first. The lower curve 621 ($m \to -\infty$) is preferably used; the horizontal and vertical segments of this path are referred to henceforth as "phase 1" and "phase 2" of the homotopy, respectively. It has been observed that using the limit curve 621 $m \to -\infty$ limit leads to a robust and efficient DC solution technique, while the limit curve 611($m \to +\infty$) curve causes failures due to inefficiency and numerical problems. An intuitive understanding of this behavior is provided by FIG. 5, where it can be seen that the latter path is "smoother" than the former, which reaches a highly nonlinear characteristic at the plot 510 $(\lambda_1,\lambda_2)=(1,0)$ before becoming smoother gain at the plot 530 $(\lambda_1,\lambda_2)=(1,1)$.

For practical design, it is necessary to obtain the operating point of the circuit using existing MOS models that have been characterized to model fabricated devices very accurately. The model of the present invention is not meant to be a substitute for such models; indeed the model of the present invention may be required to be supplemented to model second-order effects on which circuit performance is often predicated. The distinct advantage of the model of the present invention lies in the fact that the DC operating point obtained with it is very similar to that with more accurate models—hence, the DC operating point obtained by means of the present invention can be used as a starting point to solve the circuit with standard models using, for example, the Newton-Raphson method, relying on its local convergence properties. This approach works very well for most circuits.

In addition, it is possible to use the model of the present invention in combination with one or more standard models. In such instance, each MOS would be replaced by a composite weighted combination of the model of the present invention and a more accurate model with the weights depending on a third continuation parameter $\lambda_3$ ("phase 3"). Using continuation of $\lambda_3$, the composite is changed smoothly from the model of the present invention at $\lambda_3=0$ to the more accurate model at $\lambda_3=1$.

From a theoretical standpoint, it is preferable to perform all three phases (ramping $\lambda_2$, $\lambda_1$ and $\lambda_3$) as part of a single smooth homotopy, since it restores smoothness conditions that may be violated by the approach outlined above. (It is assumed throughout this Detailed Description that all device models are smooth, a condition being $C^\infty$, that the model of the present invention and most well-behaved MOS models satisfy.) This can be achieved by the straightforward extension of the construction of FIG. 5 to three continuation parameters. In practice, however, very few circuits fail as a result of the sharp corners in the limit curves of FIG. 5 and its three-dimensional extension; only one has in fact been identified, out of a conservative estimate of a few thousand conventionally hard-to-solve circuits on which the three-phase technique has been effective. The three-phase technique is preferred over the single unified homotopy because implementation becomes significantly simpler due to the decoupling of the $\lambda_1$, $\lambda_2$ and $\lambda_3$ homotopies. Further, a saving in computation is also achieved during the first and second phases because the model of the present invention is several times less expensive to compute than alternative MOS models.

Following is a table (Table 1) of results obtained by virtue of the homotopy of the present invention versus prior art models.

TABLE 1

| Circuit | Type | Size | Present Invention Converges (CPU secs) | Prior Art Announces "Failure" (CPU secs) |
|---|---|---|---|---|
| dlopatal | analog | 127 | 13 | 4331 |
| heideh | analog | 192 | 49 | 244 |
| test9 | A/D | 1380 | 599 | 3209 |
| vf_test | A/D | 1621 | 565 | 2101 |
| rabb-xare | A/D | 1877 | 1035 | 2340 |
| addas.com | A/D | 3413 | 1195 | 4395 |
| s1423 | digital | 3736 | 678 | 4207 |
| dctl.t | A/D | 7199 | 10385 | 10150 |
| goh | digital | 8489 | 3339 | 11700 |

The first and second columns list the names and types of a sampling of circuits that exhibit problems with conventional methods. The circuits range from active filters ("dlopatal"), ("heideh"), mixed analog-digital circuits involving sigma-delta analog-to-digital converters ("ADCs"), filters, phase mixers, control and division circuitry ("test9"), ("vf_test"), ("rabb-xare"), ("addas.com"), ("dctl.t") to digital blocks and static random-access memories ("s1423"), ("goh"). All circuits except s1423 were obtained from Lucent Microelectronics. s1423 is an ISCAS benchmark circuit that exhibited convergence difficulties with a conventional MOS models.

The third column lists the number of MOS devices in the circuits, which range from small (127 MOSs) to relatively large (8489 MOSs) in size. The fourth column lists the CPU time (on a Sun SPARCstation 2 with 96 MB of memory) required by the homotopy of the present invention to obtain a DC operating point of the circuit. The fifth column lists the CPU time for conventional technique to announce "failure"—this is helpful as a lower bound on he time wasted by a designer trying to obtain a solution of the circuit.

It can be seen that in most cases, it takes the model of the present invention considerably less time to obtain the DC operating point of the circuit than it takes for conventional methods to announce "failure." It should be noted, however, that for circuits on which the Newton-Raphson method (one of a number of conventional techniques that is traditionally used) succeeds, it is a factor of 2–3 times faster than the homotopy of the present invention on the average. The distinct advantage of the model of the present invention stems from its ability to solve many circuits that other methods cannot solve. This has led to large savings in design time, for it was not unusual for several days to be spent in obtaining operating points of "tough" circuits.

Figure 7:
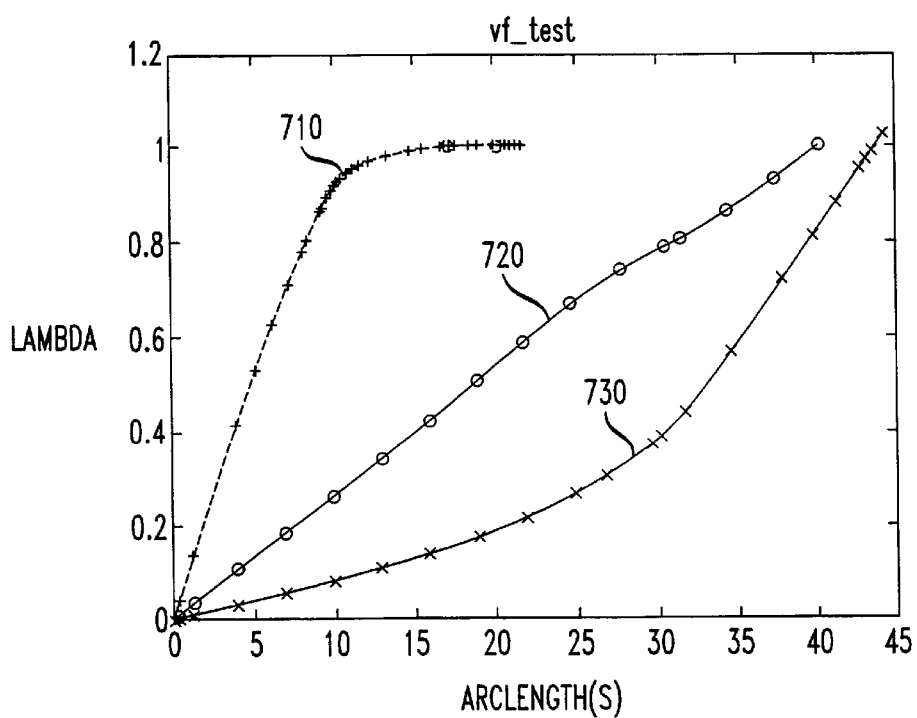
FIG. 7 illustrates solution tracks for a first exemplary test circuit.
Figure 8:
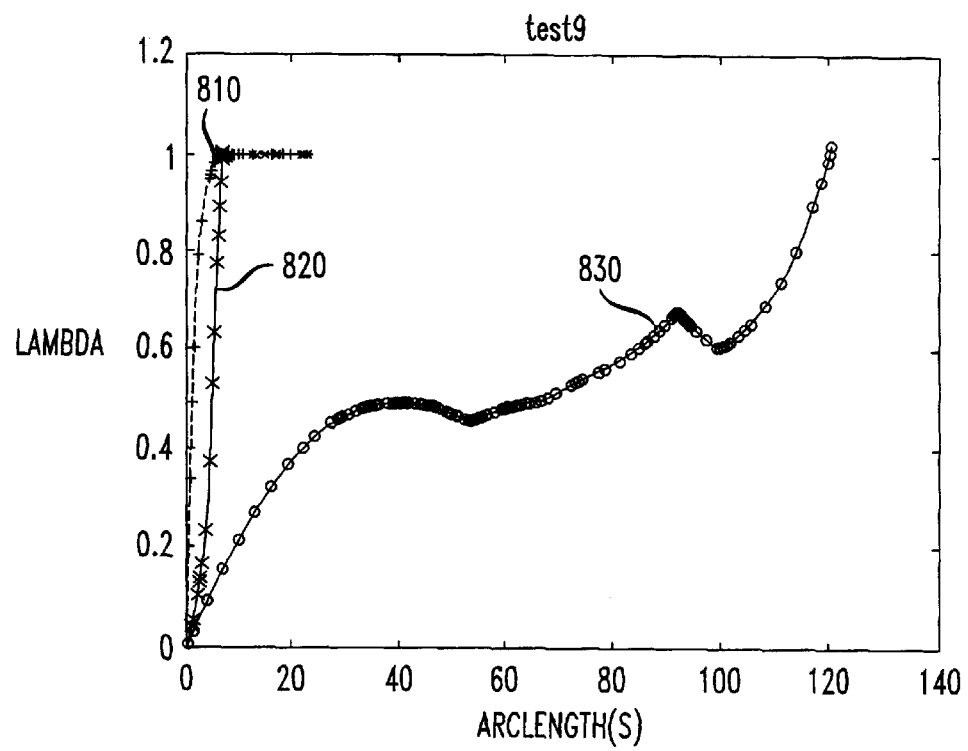
FIG. 8 illustrates solution tracks for a second exemplary test circuit.

FIGS. 7 and 8 provide graphical representations of the progress of the homotopy of the present invention for three of the above circuits. The horizontal axis represents the arclength s (s being the distance traveled from $(x_0,\lambda=0)$ to $(x,\lambda)$ along the continuation track) of the continuation of the n+1-dimensional solution curve generated by the homotopy model of the present invention. Roughly speaking, it is a measure of computation time for a given circuit. (Similar values of s do not correspond to similar computation times across different circuits.) On the vertical axis, the value of the continuation parameter $\lambda$ is plotted. This is a measure of the progress the algorithm has made; success is indicated by the track's reaching $\lambda=1$. The $\lambda$ axis represent $\lambda_2$, $\lambda_1$ or $\lambda_3$ depending on the marker on the plot. The plot marked with ○ corresponds to the first phase of the model of the present invention where $(\lambda_1,\lambda_2)$ changes from (0,0) to (0,1), i.e., $\lambda=\lambda_2$ is varied by the continuation algorithm while $\lambda_1$ is kept constant at 0. The second phase, where $\lambda=\lambda_1$ is varied while $\lambda_2$ is kept constant at 1, is depicted by the plot marked with x. The plot marked with + depicts the final phase, the transition from the model of the present invention to the more accurate model controlled by $\lambda=\lambda_3$. The solution of the circuit with the more accurate model is found when this track reaches 1 on the $\lambda$ axis.

FIG. 7 illustrates solution tracks 710, 720, 730 for a first exemplary test circuit. More particularly, the three tracks 710, 720, 730 in FIG. 7 are for the vf_test circuit. Both ○ and x tracks 710, 720 (phases 1 and 2) proceed monotonically and with relatively few points from $\lambda=0$ and $\lambda=1$, indicating that the circuit is not particularly challenging for the homotopy of the present invention. The + track 730 (phase 3) shows fast progress initially indicating very little change from the solution obtained with the model of the present invention; the progress slows as it approaches $\lambda_3=1$, indicating that the solution is changing at the last stages of the substitution of the model of the present invention by the more accurate model. This is typical of circuits in which some node voltages depend strongly on the second-order details of the MOS model being used—for example near-floating nodes whose voltages are primarily determined by the $g_{ds}$ of MOS devices connected to them.

FIG. 8 illustrates solution tracks 810, 820, 830 for a second exemplary test circuit, test9, which exhibits more interesting behavior. The first phase 830 marked by ○ is seen to be non-monotonic; it displays two pairs of turning points at which $\lambda_2$ changes from increasing to decreasing or vice versa. Circuits that display such turning points often fail with conventional methods.

Figure 9:
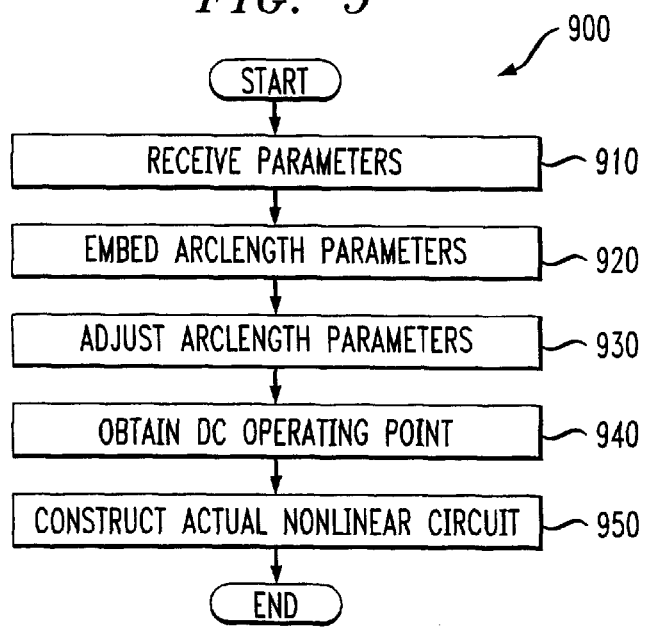
FIG. 9 illustrates a flow diagram of a method for testing and manufacturing large-scale transistor-based nonlinear circuits that relies on an initial proper determination of the DC operating point of such circuits.

Turning now to FIG. 9 illustrated is a flow diagram of a method, generally designated 900, for testing and manufacturing large-scale transistor-based nonlinear circuits that relies on an initial proper determination of the DC operating point of such circuits.

The method 900 begins in a step 910 wherein parameters relating to a given transistor-based nonlinear circuit are received into a globally-convergent model of the nonlinear circuit. The model is illustrated as being homotopic, and is preferably symmetric and bulk-referenced. Next, in a step 920, at least two arclength continuation parameters, preferably relating to driving-point and transfer characteristics of at least one transistor in the nonlinear circuit, are embedded into the globally-convergent model. Next, in a step 930, the arclength continuation parameters are adjusted to cause the globally-convergent model to converge on a DC operating point for the nonlinear circuit.

In an optional step 940, the DC operating point obtained in the step 930 is employed to determine an overall response characteristic of the nonlinear circuit. The overall response characteristic may be selected from the group consisting of: (1) small-signal response, (2) transient response and (3) noise response. Finally, in a step 950, an actual nonlinear circuit having the modeled DC operating point is constructed. Based on Dc operating point or other characteristic data obtained from modeling the nonlinear circuit, the nonlinear circuit may be subjected to (perhaps significant) redesign before actual construction, thereby contributing to the speed at which large, heretofore difficult, nonlinear circuits can be designed and manufactured.

The present invention may further be augmented with a probabilistic technique to allow it to solve even more circuits. The probabilistic technique introduces perturbations into the homotopy to circumvent any solution inefficiency caused by circuit topologies involving parallel bistable structures. Occurrences of this phenomenon are rare, however; the examples shown above represent typical performance of the model of the present invention on circuit encountered in industry.

Although the present invention and its advantages have been described in detail, those skilled in the art should understand that they can make various changes, substitutions and alterations herein without departing from the spirit and scope of the invention in its broadest form.

What is claimed is:

1. A system for testing a transistor-based nonlinear circuit, comprising:

a DC operating point determination circuit that receives parameters relating to said nonlinear circuit into a globally-convergent model thereof and embeds therein at least two arclength continuation parameters relating to driving-point and transfer characteristics of a transistor in said nonlinear circuit, said DC operating point determination circuit capable of adjusting said arclength continuation parameters to cause said globally-convergent model to converge on a DC operating point for said nonlinear circuit; and an analysis circuit, coupled to said DC operating point determination circuit, that employs said DC operating point to determine an overall response characteristic of said nonlinear circuit.

2. The system as recited in claim 1 wherein said globally-convergent model is a homotopic model.

3. The system as recited in claim 1 wherein said transistor is a metal-oxide semiconductor (MOS) device.

4. The system as recited in claim 1 wherein one of said at least two arclength continuation parameters relates to a drain-source driving-point characteristic of said transistor.

5. The system as recited in claim 1 wherein one of said at least two arclength continuation parameters relates to an influence of gate voltage on drain-source current of said transistor.

6. The system as recited in claim 1 wherein said globally-convergent model is symmetric and bulk-referenced.

7. The system as recited in claim 1 wherein said overall response characteristic is selected from the group consisting of:

small-signal response, transient response, and noise response.

8. A method of manufacturing a transistor-based nonlinear circuit, comprising the steps of:

receiving parameters relating to said nonlinear circuit into a globally-convergent model thereof;

embedding in said globally-convergent model at least two arclength continuation parameters relating to driving-point and transfer characteristics of a transistor in said nonlinear circuit;

adjusting said arclength continuation parameters to cause said globally-convergent model to converge on a DC operating point for said nonlinear circuit; and constructing a circuit having said DC operating point.

9. The method as recited in claim 8 wherein said globally-convergent model is a homotopic model.

10. The method as recited in claim 8 wherein said transistor is a metal-oxide semiconductor (MOS) device.

11. The method as recited in claim 8 wherein one of said at least two arclength continuation parameters relates to a drain-source driving-point characteristic of said transistor.

12. The method as recited in claim 8 wherein one of said at least two arclength continuation parameters relates to an influence of gate voltage on drain-source current of said transistor.

13. The method as recited in claim 8 wherein said globally-convergent model is symmetric and bulk-referenced.

14. The method as recited in claim 8 further comprising the step of employing said DC operating point to determine an overall response characteristic selected from the group consisting of:

small-signal response, transient response, and noise response.

15. A nonlinear circuit manufactured by the method of claim 8.

16. A system for testing a metal-oxide semiconductor (MOS)-based nonlinear circuit, comprising:

a DC operating point determinor that receives parameters relating to said nonlinear circuit into a symmetric, bulk-referenced homotopic model thereof and embeds therein at least two arclengt continuation parameters relating to driving-point and transfer characteristics of a MOS in said nonlinear circuit, said DC operating point determinor capable of adjusting said arclength continuation parameters to cause said homotopic model to converge on a DC operating point for said nonlinear circuit; and an analysis circuit, coupled to said DC operating point determinor, that employs said DC operating point to test said nonlinear circuit.

17. The system as recited in claim 16 wherein said DC operating point determinor is embodied as a sequence of software instructions executable in logic circuitry.

18. The system as recited in claim 16 wherein one of said at least two arclength continuation parameters relates to a drain-source driving-point characteristic of said MOS.

19. The system as recited in claim 16 wherein one of said at least two arclength continuation parameters relates to an influence of gate voltage on drain-source current of said MOS.

20. The system as recited in claim 16 wherein said analysis circuit tests said nonlinear circuit for an overall response characteristic selected from the group consisting of:

small-signal response, transient response, and noise response.

21. The system as recited in claim 16 wherein said DC operating point determinor further employs a local-convergence model to converge on said DC operating point.

* * * * *